United States Patent
Tamaki et al.

(10) Patent No.: US 8,558,121 B2
(45) Date of Patent: Oct. 15, 2013

(54) ELECTRONIC DEVICE HAVING AN ELECTROMAGNETIC SHIELD

(75) Inventors: Yuta Tamaki, Tokyo (JP); Hiroaki Tsurumi, Tokyo (JP); Keiichi Aoki, Tokyo (JP)

(73) Assignees: Sony Corporation, Tokyo (JP); Sony Computer Entertainment, Inc., Tokyo (JP)

( * ) Notice: Subject to any disclaimer, the term of this patent is extended or adjusted under 35 U.S.C. 154(b) by 170 days.

(21) Appl. No.: 13/048,035

(22) Filed: Mar. 15, 2011

(65) Prior Publication Data

US 2011/0226523 A1    Sep. 22, 2011

(30) Foreign Application Priority Data

Mar. 17, 2010    (JP) .................. 2010-061705

(51) Int. Cl.
*H05K 9/00* (2006.01)

(52) U.S. Cl.
USPC ........... 174/366; 174/351; 174/354; 361/816; 361/818

(58) Field of Classification Search
USPC .............. 174/351, 354, 366, 377, 384, 387; 361/816, 818
See application file for complete search history.

(56) References Cited

U.S. PATENT DOCUMENTS

| | | | | |
|---|---|---|---|---|
| 5,335,147 A * | 8/1994 | Weber | ........................ | 361/818 |
| 5,519,585 A * | 5/1996 | Jones et al. | ................... | 361/818 |
| 5,768,110 A * | 6/1998 | Frommer et al. | ............. | 361/755 |
| 6,814,592 B1 * | 11/2004 | Stahl | ............................. | 439/108 |
| 6,930,891 B1 * | 8/2005 | Hama et al. | ................... | 361/800 |
| 8,043,098 B2 * | 10/2011 | Huang | ............................ | 439/95 |

FOREIGN PATENT DOCUMENTS

| | | |
|---|---|---|
| JP | 58-148990 | 10/1983 |
| JP | 2000-49486 | 2/2000 |
| JP | 2009-224393 | 10/2009 |

OTHER PUBLICATIONS

Japanese Office Action dated Jan. 10, 2012, from corresponding Japanese Application No. 2010-061705.

* cited by examiner

*Primary Examiner* — Hoa C Nguyen
*Assistant Examiner* — Amol Patel
(74) *Attorney, Agent, or Firm* — Katten Muchin Rosenman LLP

(57) ABSTRACT

An electronic device includes an upper shield arranged on a front side of a circuit board, and a lower shield arranged on a back side thereof. The lower shield includes a contact portion at an edge thereof. The contact portion is in contact with a lower surface of the circuit board. A plate spring portion is formed in the contact portion. An end portion of the plate spring portion abuts on the upper shield.

11 Claims, 7 Drawing Sheets

ELECTRONIC DEVICE HAVING AN ELECTROMAGNETIC SHIELD

CROSS-REFERENCE TO RELATED APPLICATION

The present application claims priority from Japanese application JP 2010-061705 filed on Mar. 17, 2010, the content of which is hereby incorporated by reference into this application.

BACKGROUND OF THE INVENTION

1. Field of the Invention

The present invention relates to an electronic device including plate shaped shields, which are provided on a front side and a back side of a circuit board, for improving electromagnetic tolerance of the electronic device.

2. Description of the Related Art

There is known a conventional electronic device (for example, personal computer, game device, or audio-visual device), which includes a plate shaped shield covering a circuit board in order to ensure electromagnetic tolerance of the electronic device (that is, in order to block an electromagnetic wave emitted from an electronic component on the circuit board, and in order to reduce an influence from an electromagnetic wave which other electronic device emits).

In U.S. Pat. No. 6,930,891, a shield has a plurality of plate-spring-like connecting portions formed on the edge of the shield. Through the connecting portions, the shield is in contact with the conductive pattern for grounding formed on the front surface of the circuit board. By using plate-spring-like connecting portions, connection stability between the conductive pattern and the shield is improved.

Specifically, the shield of U.S. Pat. No. 6,930,891 has a plate shaped portion (hereinafter, referred to as upper plate portion) which is spaced apart from the front surface of the circuit board and is parallel to the circuit board. Further, a plurality of slits are formed in the edge of the upper plate portion. Portions between the slits function as the connecting portions. Each of the connecting portions is bent downward at midpoint thereof to extend toward the front surface of the circuit board, and is in contact with the conductive pattern at the lower end of the connecting portion.

SUMMARY OF THE INVENTION

In recent years, a signal to be used in the electronic device has higher frequency, and hence there is a demand for stronger tolerance against the electromagnetic wave. Thus, in some cases, not only the front surface of the circuit board is covered with the shield, but also the back surface of the circuit board is covered with another shield which is electrically connected to the shield on the front side.

In such a structure, the plate-spring-like connecting portions as disclosed in U.S. Pat. No. 6,930,891 may be used in order to ensure stability in electrical connection between the two shields. That is, the following structure may be employed. The plate-spring-like connecting portions are formed on the edge of any one of the shields, and the end portions of the connecting portions are in contact with another one of the shields.

However, in U.S. Pat. No. 6,930,891, the slits are formed in the right and left of each of the connecting portions, and the connecting portions extend downward from the edge of the upper plate portion spaced apart from the front surface of the circuit board. Thus, the inside and the outside of the shield may communicate to each other through the slits, which leads to reduce a shield effect against the electromagnetic wave.

The electronic device according to the present invention includes: a circuit board; a first shield serving as a plate shaped shield covering one surface of the circuit board, and including a contact portion formed in at least one part of an edge of the first shield and being in contact with the one surface of the circuit board; a connecting portion extending from the contact portion of the first shield and being elastically deformable so that its end portion moves in a thickness direction of the circuit board; and a second shield serving as a plate shaped shield covering another surface of the circuit board, the end portion of the connecting portion abutting on the second shield.

According to the present invention, the contact portion of the first shield is in contact with the one surface of the circuit board, and the connecting portion extends from the contact portion. Therefore, slits, which is formed in the above conventional shield, are not formed in the right and left of the connecting portion, and hence it is possible to improve the shield effect against the electromagnetic wave.

DETAILED DESCRIPTION OF THE INVENTION

Figure 1:
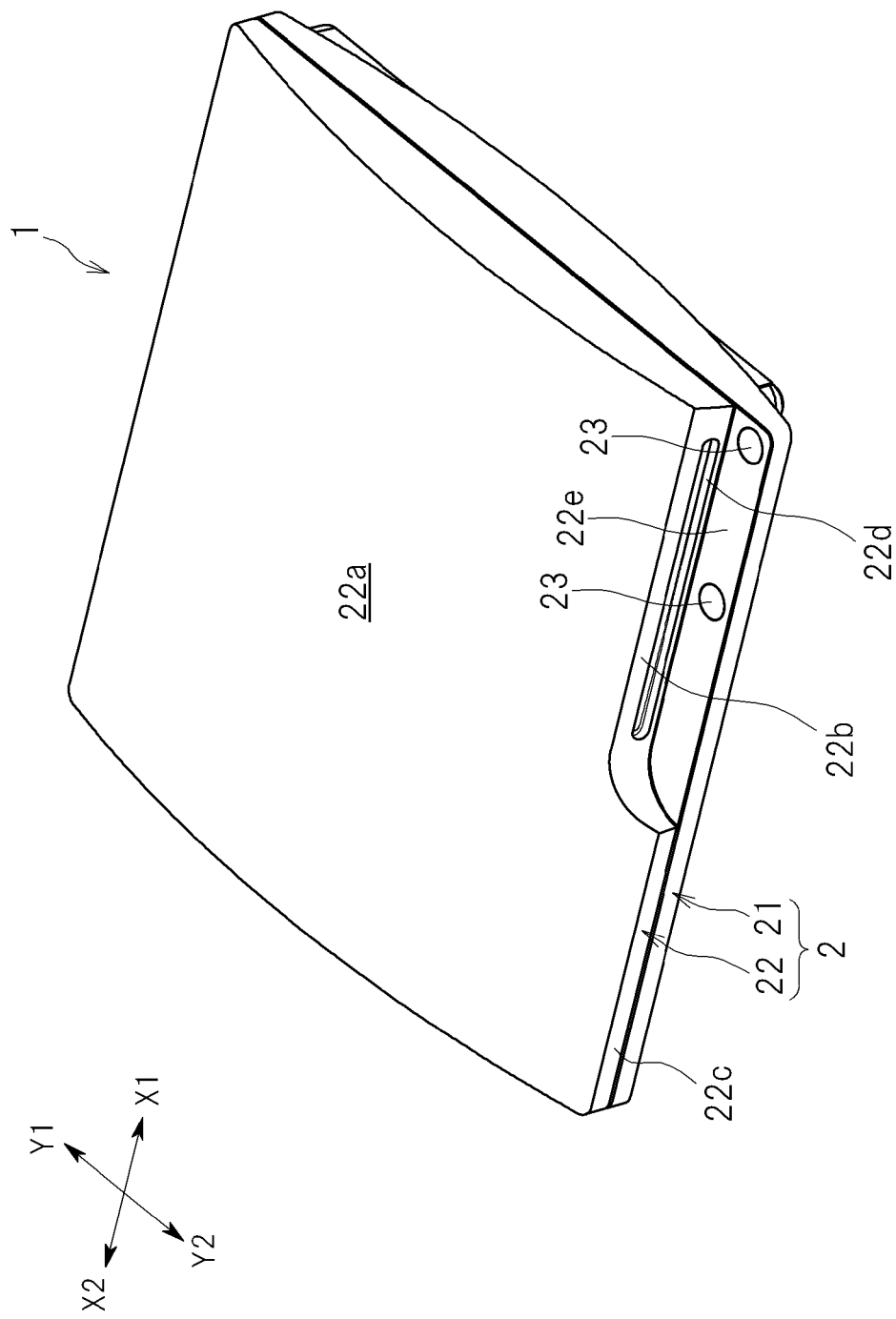
FIG. 1 is a perspective view of an electronic device according to an embodiment of the present invention.
Figure 2:
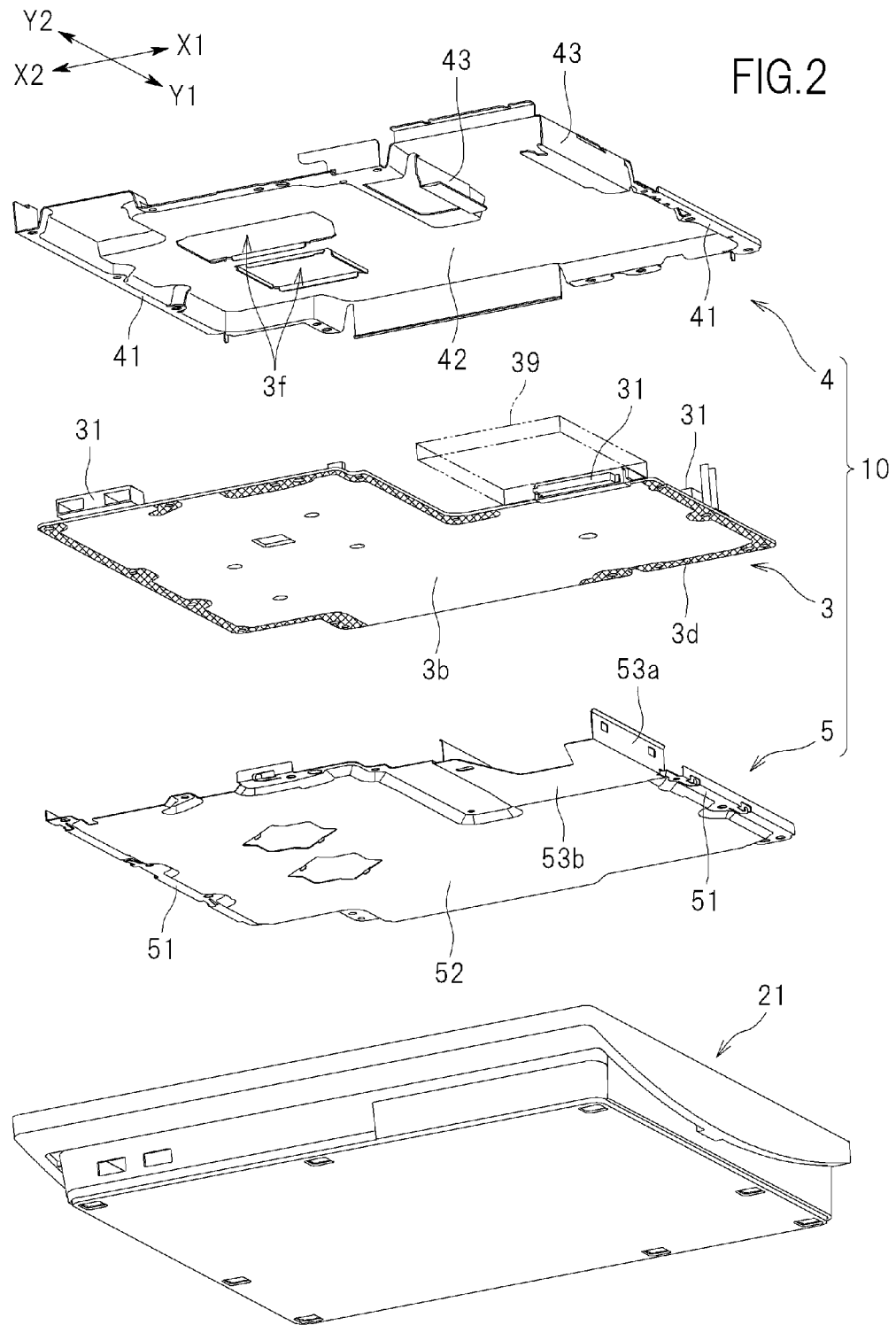
FIG. 2 is an exploded perspective view of a circuit board assembly built in the electronic device.
Figure 3:
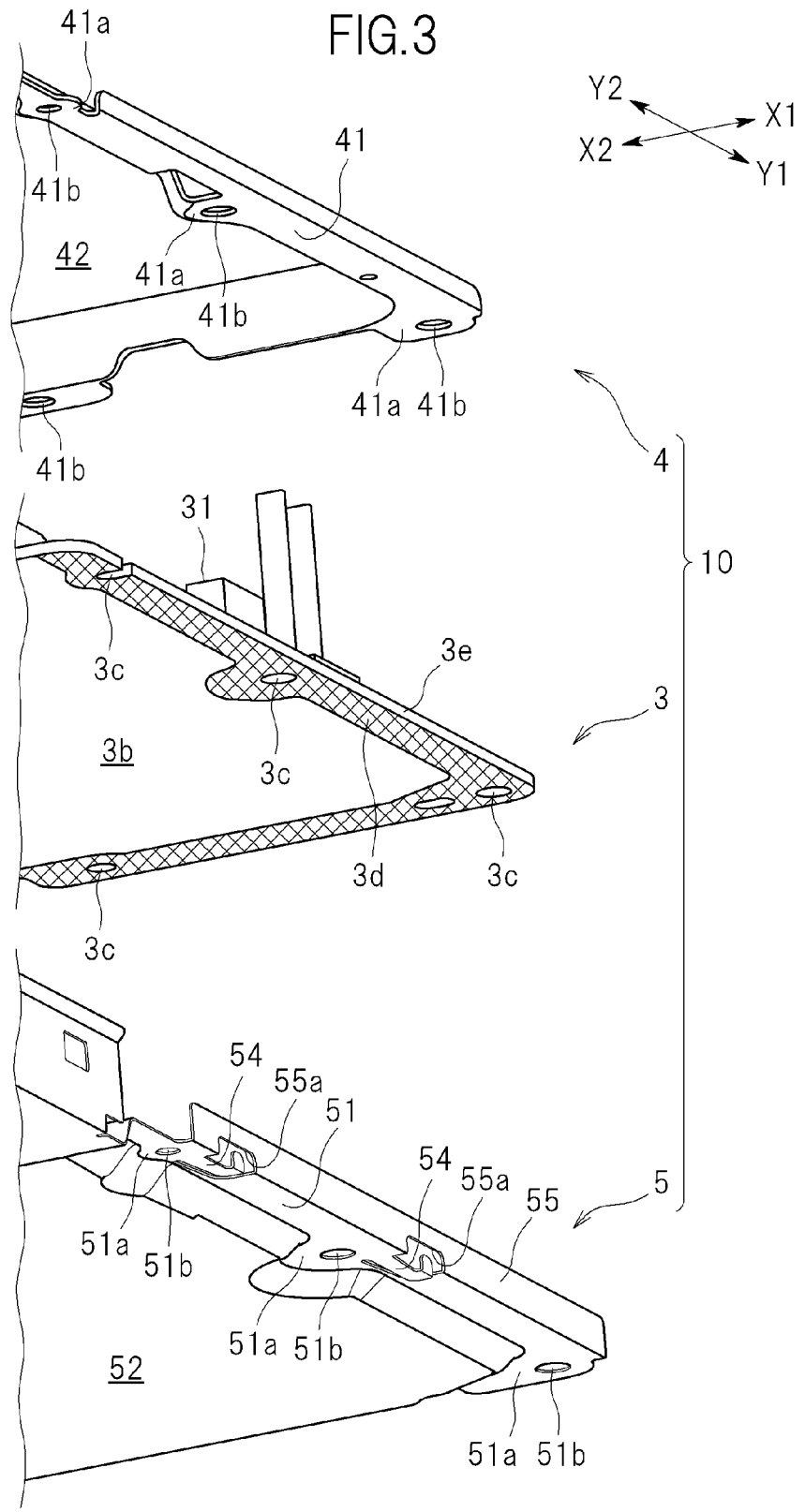
FIG. 3 is an enlarged view of FIG. 2, in which right edges of a circuit board, an upper shield, and a lower shield constituting the circuit board assembly are enlarged.
Figure 4:
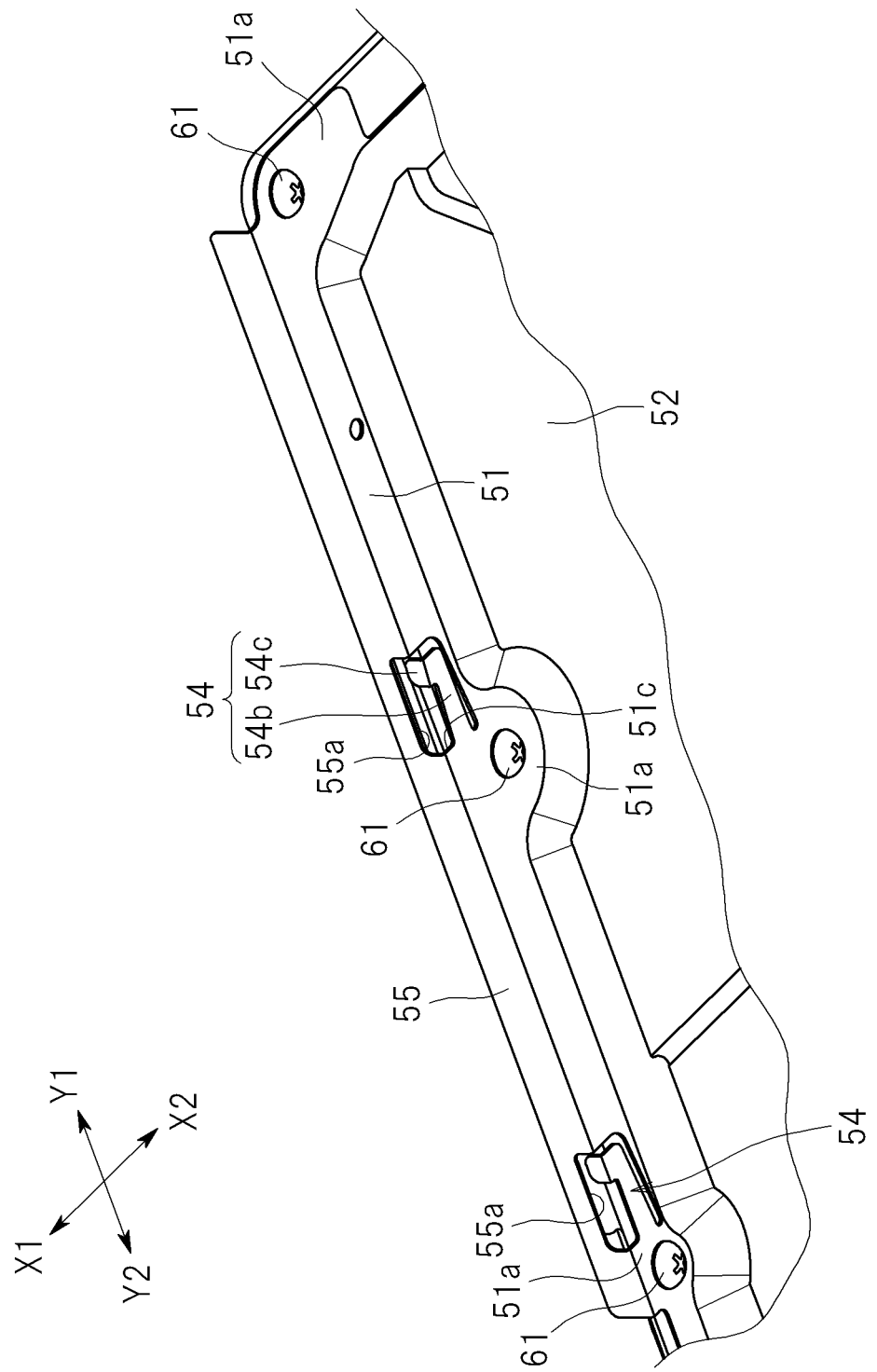
FIG. 4 is a perspective view of the circuit board assembly.
Figure 5:
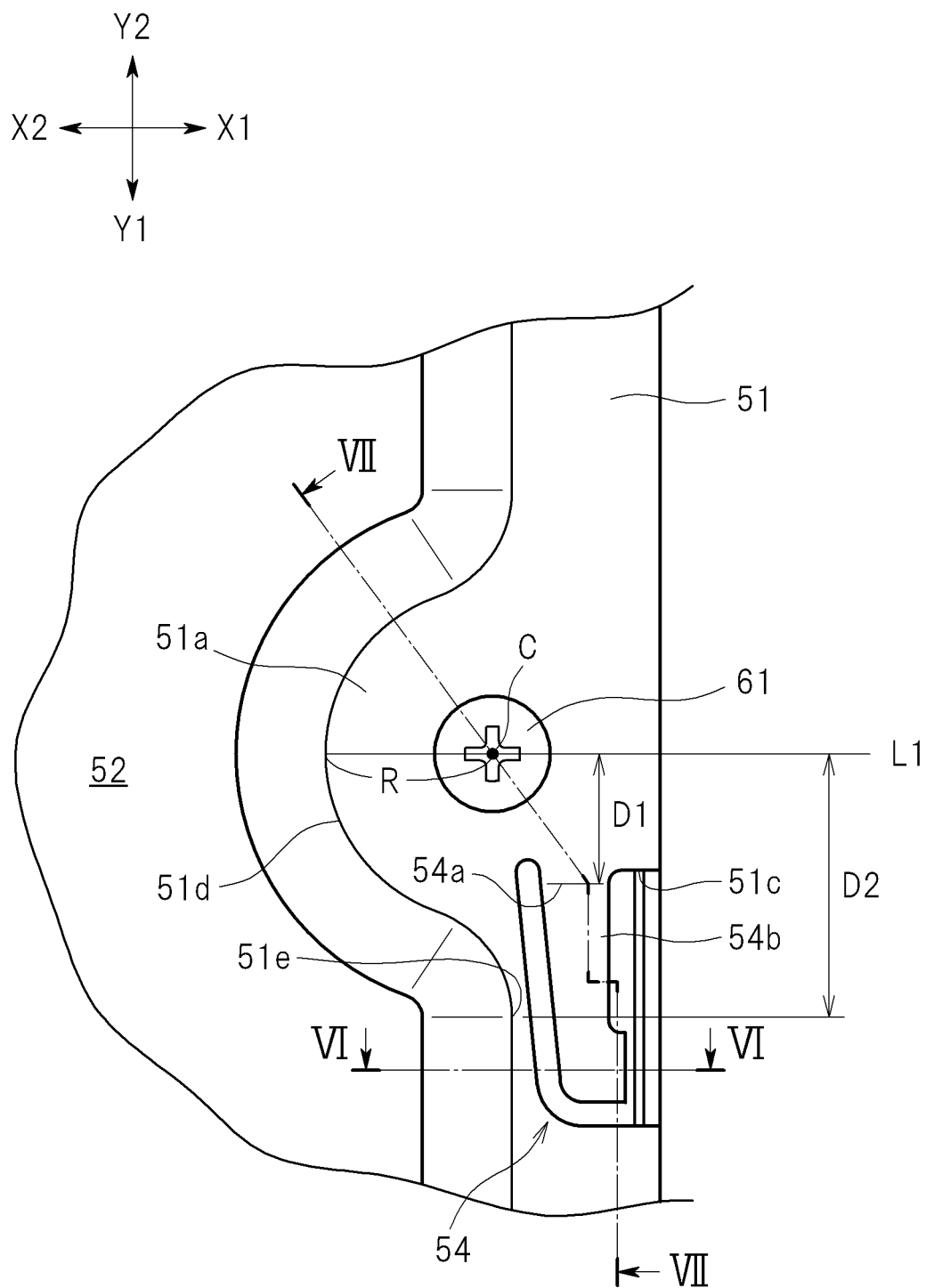
FIG. 5 is a bottom view of a main part of the circuit board assembly, which illustrates a part provided with a plate spring portion of the lower shield.
Figure 6:
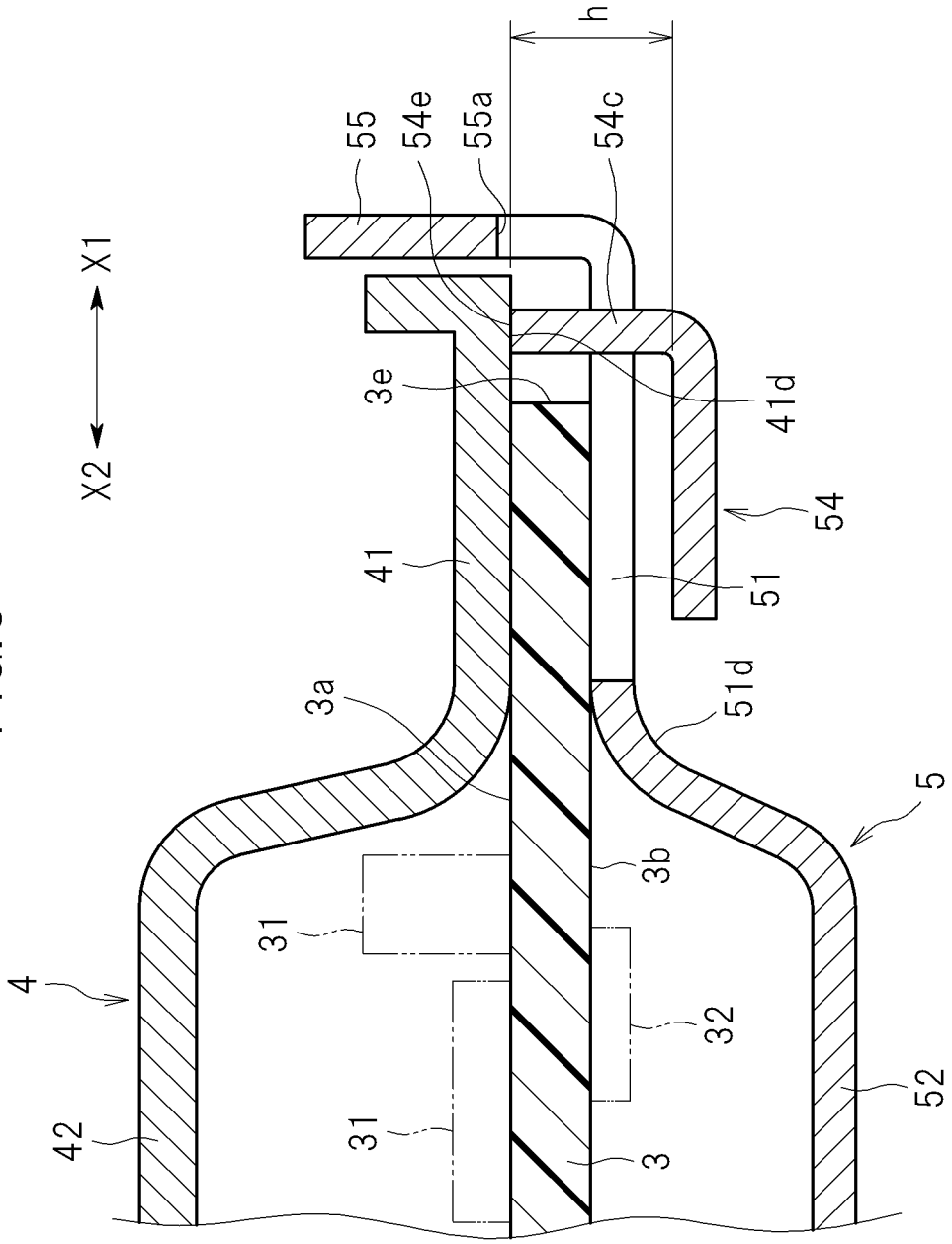
FIG. 6 is a sectional view taken along the line VI-VI of FIG. 5.
Figure 7:
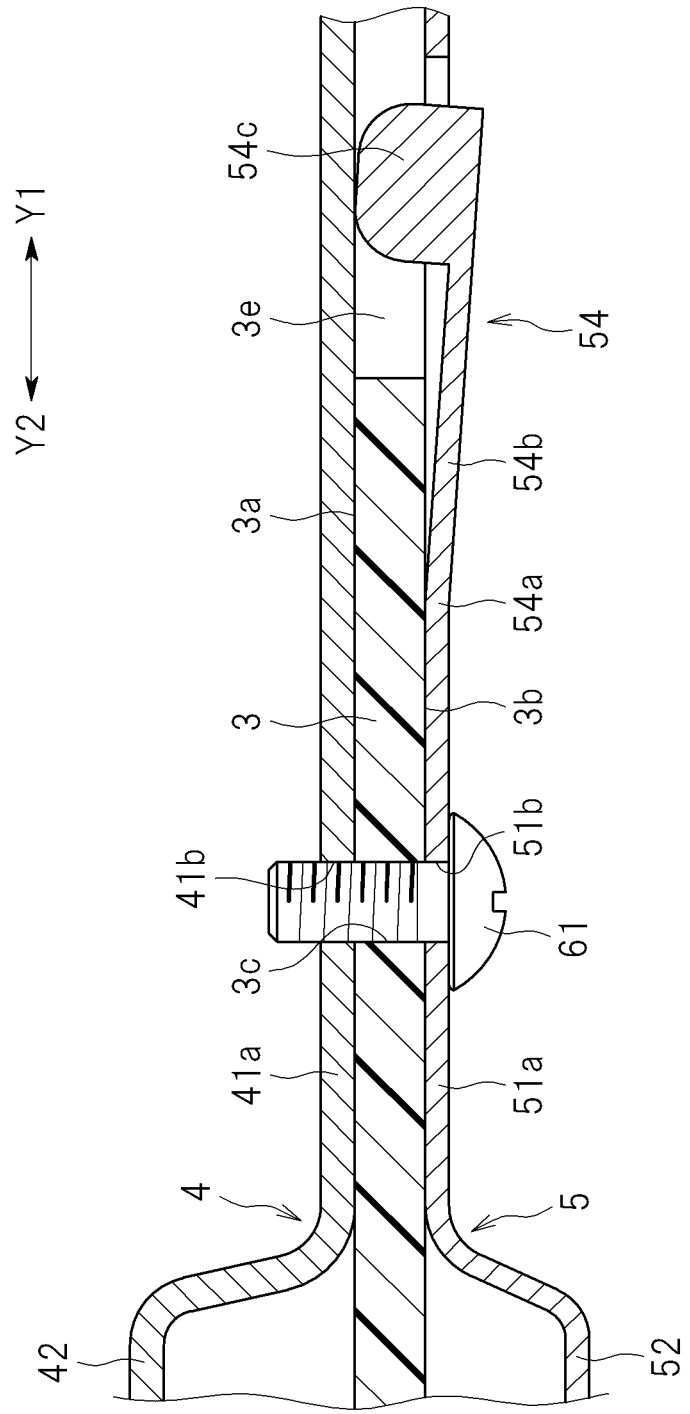
FIG. 7 is a sectional view taken along the line of VII-VII of FIG. 5.

Hereinafter, an embodiment of the present invention is described with reference to the drawings. FIG. 1 is a perspective view of an electronic device 1 defining an example of the embodiment of the present invention. FIG. 2 is an exploded perspective view of a circuit board assembly 10 built in the electronic device 1, which illustrates a state in which an upper shield 4, a circuit board 3, and a lower shield 5 constituting the circuit board assembly 10 are viewed obliquely from below. FIG. 3 is an enlarged view of FIG. 2. FIG. 4 is a perspective view of a main part of the circuit board assembly 10, which illustrates a state in which a part provided with a plate spring portion 54 of the lower shield 5 is viewed obliquely from below. FIG. 5 is a bottom view of a main part of the circuit board assembly 10, which illustrates the plate spring portion 54 in an enlarged manner. FIG. 6 is a sectional view taken along the line VI-VI of FIG. 5. FIG. 7 is a sectional view taken along the line VII-VII of FIG. 5.

As illustrated in FIG. 1 or FIG. 2, the electronic device 1 includes the circuit board assembly 10 and a housing 2 housing the circuit board assembly 10. The housing 2 includes a box shaped lower housing 21 opened upward, and a box shaped upper housing 22 opened downward and covering the upper side of the lower housing 21. The upper housing 22 is provided with an upper plate portion 22a situated above the circuit board assembly 10. Further, the upper housing 22 includes a right front wall portion 22b and a left front wall portion 22c which extend downward from a front edge of the upper plate portion 22a toward the lower housing 21. The electronic device 1 serves as a game device or an audio-visual device which can read data and a program stored in a hard disc device, a disc shaped portable storage medium such as an optical disc, and the like, and can provide moving images and sounds to a user. An insertion slot 22d, through which such a portable storage medium is inserted, is formed in the right front wall portion 22b. The right front wall portion 22b is situated rearward of the left front wall portion 22c, and a front board 22e spreading forward (in direction indicated by Y2) from a lower edge of the right front wall portion 22b is arranged in front of the right front wall portion 22b. The front board 22e is provided with a plurality of buttons 23 functioning as a power button, an eject button for ejecting a storage medium, and the like.

As illustrated in FIG. 2, the circuit board assembly 10 includes the circuit board 3, and the upper shield (second shield in claims) 4 and the lower shield (first shield in claims) 5 for ensuring electromagnetic tolerance of the electronic device 1.

As illustrated in FIG. 6, a plurality of electronic components 31, such as an IC chip, a capacitor, and a connector, are mounted on an upper surface 3a of the circuit board 3. Similarly, a plurality of electronic components 32 are mounted also on a lower surface 3b of the circuit board 3. As illustrated in FIG. 2, the circuit board 3 in this example has a shape obtained by cutting away a quadrangular part of a quadrangle. In a space corresponding to the cut-away part, for example, a box shaped device 39 such as a hard disk device is arranged.

The upper shield 4 is a substantially quadrangular plate shaped member, and covers the upper surface 3a of the circuit board 3. The upper shield 4 is formed of, for example, a metal plate made of iron, aluminum, etc. The upper shield 4 is manufactured by, for example, sheet metal working. As illustrated in FIG. 2 and FIG. 6, the upper shield 4 includes a contact portion 41 at a peripheral edge thereof. The lower surface of the contact portion 41 is in contact with the upper surface 3a of the circuit board 3. In this example, the contact portion 41 is formed into a belt-like shape extending along the peripheral edge of the upper shield 4 and surrounding the electronic components 31 mounted on the upper surface 3a of the circuit board 3. Further, as illustrated in FIG. 2 or FIG. 6, a clearance is formed between the upper surface 3a of the circuit board 3 and a part of the upper shield 4 surrounded by the contact portion 41 (hereinafter, the part will be referred to as main panel portion 42). The electronic components 31 are situated in the clearance. That is, the main panel portion 42 is situated over the electronic components 31. In this example, some of the electronic components 31 such as a connector, and a contact pad for soldering are situated on the peripheral edge of the upper surface 3a. Thus, the contact portion 41 is formed to extend intermittently along the peripheral edge of the upper shield 4 while avoiding the electronic components 31 and the like.

The main panel portion 42 of the upper shield 4 has a plurality of openings 3f formed thereon. The openings 3f serve as, for example, openings for exposing upward some of the electronic components 31 (for example, IC chip) mounted on the circuit board 3, and establishing a contact between the electronic components 31 and a cooling device arranged on the upper shield 4. Further, the upper shield 4 in this example includes side wall portions 43 for surrounding an outer surface of the above-mentioned box shaped device 39. Further, the upper shield 4 is formed of a plate thicker than a plate for the lower shield 5, and is fixed onto the housing 2 together with the lower shield 5 and the circuit board 3. Thus, the upper shield 4 functions also as a frame for the electronic device 1.

Similarly to the upper shield 4, the lower shield 5 is a substantially quadrangular plate shaped member in plan view, and covers the lower surface 3b of the circuit board 3. The lower shield 5 is also formed of, for example, a metal plate made of aluminum, iron, etc. The lower shield 5 is manufactured by, for example, sheet metal working. As illustrated in FIG. 2 or FIG. 6, the lower shield 5 includes a contact portion 51 at a peripheral edge thereof. The contact portion 51 includes a part of one surface (in this example, upper surface) of the lower shield 5, the one surface facing the circuit board 3. The upper surface of the contact portion 51 is in contact with the lower surface 3b of the circuit board 3. In other words, the upper surface of the lower shield 5 is in contact with the lower surface 3b of the circuit board 3 through the contact portion 51.

The contact portion 51 is formed to a belt-like shape extending along the peripheral edge of the lower shield 5 and surrounding the electronic components 32 mounted on the lower surface 3b of the circuit board 3. A clearance is formed between the lower surface 3b of the circuit board 3 and a part of the lower shield 5 surrounded by the contact portion 51 (hereinafter, the part will be referred to as a main panel portion 52). The electronic components 32 are situated in the clearance. That is, the main panel portion 52 is situated under the electronic components 32. In this example, some of the electronic components 32, a contact pad for soldering, and the like are situated on the peripheral edge of the circuit board 3. Thus, the contact portion 51 is formed to extend intermittently along the peripheral edge of the lower shield 5 while avoiding the contact pad and the like. Further, as illustrated in FIG. 2, the lower shield 5 is also provided with a side wall portion 53a and a bottom portion 53b, both of which surround the above-mentioned device 39.

The contact portion 41 of the upper shield 4 and the contact portion 51 of the lower shield 5 are fixed onto the upper surface 3a and the lower surface 3b of the circuit board 3, respectively. That is, as illustrated in FIG. 3 or FIG. 7, the contact portion 41 includes a fixed portion 41a at some midpoint thereof. And the contact portion 51 includes a fixed portion 51a at some midpoint thereof. The fixed portions 41a, 51a are each provided with a fixture (for example, elongated columnar fixture such as a screw or a bolt), and the contact portions 41, 51 are fixed respectively onto the upper surface 3a and the lower surface 3b of the circuit board 3 with the fixtures.

As illustrated in FIG. 3, the contact portion 41 is provided with a plurality of fixed portions 41a, and the contact portion 51 is provided with a plurality of fixed portions 51a. A part of the contact portion 41 is larger in width than other part of the contact portion 41. And a part of the contact portion 51 is larger in width than other part of the contact portion 51. The parts with larger widths serve as the fixed portions 41a, 51a. In this example, the fixed portions 41a, 51a are substantially circular (see FIG. 5), and have holes 41b, 51b formed in centers thereof, respectively. The holes 41b are aligned at intervals along an edge of the upper shield 4. The holes 51b are aligned at intervals along an edge of the lower shield 5. The circuit board 3 has a plurality of holes 3c formed also along an edge of the circuit board 3. The holes 3c are also formed at intervals along the edge of the circuit board 3. The holes 3c, 41b, and 51b correspond to one another in position. And hence, when the lower shield 5, the circuit board 3, and the upper shield 4 are superimposed on one another, the holes 3c, 41b, and 51b are aligned in an up-and-down direction. A screw 61 is inserted into the holes 3c, 41b, and 51b from below (see FIG. 5 and FIG. 7). In this way, the fixed portions 41a, 51a are fixed onto the circuit board 3, and the contact portions 41, 51 come in close contact with the upper surface 3a and the lower surface 3b of the circuit board 3, respectively. In particular, the fixed portions 41a, 51a are reliably held in close contact with the upper surface 3a and the lower surface 3b of the circuit board 3, respectively. Note that, the hole 41b has a screw groove formed on an inner surface thereof, and the screw groove is engaged with the screw 61.

As illustrated in FIG. 3, a conductive pattern 3d for grounding is formed on the lower surface 3b of the circuit board 3. The fixed portions 51a are in contact with the conductive pattern 3d. In this example, the conductive pattern 3d is formed on the peripheral edge of the lower surface 3b of the circuit board 3. The conductive pattern 3d is formed into a belt-like shape extending along the peripheral edge of the circuit board 3 and surrounding the electronic components 32 mounted on the lower surface 3b of the circuit board 3 (see FIG. 2). Thus, not only the fixed portions 51a but also the contact portion 51 is in contact with the conductive pattern 3d. In particular, contact stability between each of the fixed portions 51a and the conductive pattern 3d is ensured by fastening with the screw 61. In FIG. 2 and FIG. 3, for distinguishing the conductive pattern 3d, the conductive pattern 3d is hatched.

As illustrated in FIG. 3 to FIG. 5, a plurality of plate spring portions (connecting portion in claims) 54 are formed on a part of the edge of the lower shield 5 which is in contact with the lower surface 3b of the circuit board 3. That is, the plate spring portions 54 are formed on the contact portion 51. FIG. 4 illustrates the plurality of (two in this figure) plate spring portions 54 aligned along a right edge of the lower shield 5. Each of the plate spring portions 54 includes an elastic plate portion 54b capable of elastically warping, and an abutting portion 54c provided at an end portion of the elastic plate portion 54b.

A quadrangular part is cut out from the belt-like contact portion 51. The elastic plate portion 54b extends from an edge 51c formed by the cutting out, and is situated in a space corresponding to the cut-out part. Thus, the elastic plate portion 54b is surrounded by the contact portion 51. The elastic plate portion 54b extends in a direction (extending direction of the contact portion 51) along the edge of the lower shield 5 (in other words, edge of the circuit board 3). With this structure, it is possible to reduce an influence of the plate spring portion 54 against a shape of other portion of the lower shield 5. That is, in a structure in which the elastic plate portion 54b is extended in a direction perpendicular to the edge of the lower shield 5, it is necessary to increase a width of the contact portion 51 toward the main panel portion 52. Or it is necessary to form a plurality slits on the edge of the main panel portion 52 to thereby employ a portion between the slits as the elastic plate portion 54b. In contrast, in a structure where the elastic plate portion 54b is extended in a direction along the edge of the lower shield 5 as in this example, it is unnecessary to increase the width of the contact portion 51 as described above, or to form the slits in the main panel portion 52. Further, while keeping a state in which the upper surface of the contact portion 51 is in contact with the lower surface 3b of the circuit board 3, it is possible to adjust a length of the elastic plate portion 54b. As a result, it is possible to easily set an elastic force exerted by the plate spring portion 54 to an appropriate magnitude. Further, the elastic plate portion 54b does not protrude in the direction perpendicular to the edge of the lower shield 5, and hence it is possible to prevent an increase in size of the circuit board assembly 10.

Further, the elastic plate portion 54b is formed into an elongated plate shape, and faces the lower surface 3b of the circuit board 3. As illustrated in FIG. 4, the plurality of (two in this case) elastic plate portions 54b provided at the same side of the lower shield 5 extend in the same direction (direction indicated by Y1 in FIG. 4).

As illustrated in FIG. 6, an end portion of the plate spring portion 54 is bent toward the upper shield 4. That is, the plate spring portion 54 is bent at a distal end of the elastic plate portion 54b in a thickness direction of the circuit board 3. In this way, the abutting portion 54c is formed at the end portion of the plate spring portion 54. The abutting portion 54c extends from a side edge of the distal end of the elastic plate portion 54b toward the upper shield 4. The abutting portion 54c has a small plate shape. The abutting portion 54c faces a side surface 3e defining a thickness of the circuit board 3.

As illustrated in FIG. 6, the abutting portion 54c abuts on the edge of the upper shield 4 (that is, contact portion 41). In this example, the edge of the upper shield 4 is situated beyond the edge (side surface 3e) of the circuit board 3 outwardly (in a direction perpendicular to the edge (direction indicated by X1 in FIG. 6)). That is, the contact portion 41 includes an outer portion (hereinafter, referred to as projecting portion) 41d situated further outward than the edge of the circuit board 3. The distal end of the abutting portion 54c is in contact with the lower surface of the projecting portion 41d. That is, the abutting portion 54c and the projecting portion 41d abut on each other in the up-and-down direction (thickness direction of the circuit board 3).

As described above, the lower shield 5 is formed by sheet metal working. In a manufacturing process for the lower shield 5, punching process or the like removes a part around the portion to define the plate spring portion 54 from a plate shaped metal, to thereby form the plate spring portion 54. Then, the end portion of the plate spring portion 54 is bent, to thereby form the abutting portion 54c. Accordingly, a cut surface obtained by the punching process or the like serves as a surface 54e of the abutting portion 54c which is in contact with the projecting portion 41d (hereinafter, the surface 54e will be referred to as contact surface). Therefore, even when the plate shaped metal used as an original material for the lower shield 5 is plated in advance, the contact surface 54e of the abutting portion 54c is not plated. With this, conductivity between the plate spring portion 54 and the upper shield 4 can be increased.

When the plate spring portion 54 is in a free state, that is, when the upper shield 4 is dismounted from the circuit board 3 and hence no external force acts on the plate spring portion 54, the elastic plate portion 54b is in contact with the lower surface 3b of the circuit board 3. Further, a height of the abutting portion 54c (distance (indicated by h in FIG. 6) between the elastic plate portion 54b and the distal end of the abutting portion 54c) is larger than the thickness of the circuit board 3. Thus, as illustrated in FIG. 7, when the upper shield 4, the lower shield 5, and the circuit board 3 are fixed to one another, and the screw 61 provided in the fixed portion 51a is fastened, the abutting portion 54c is pressed by the projecting portion 41d of the upper shield 4 in the thickness direction of the circuit board 3 (specifically, downward). As a result, the elastic plate portion 54b is warped with the base 54a as an origin, and is inclined to be separated from the lower surface 3b of the circuit board 3. When the elastic plate portion 54b is inclined in this manner, the elastic force of the elastic plate portion 54b presses the abutting portion 54c onto the upper shield 4 (specifically, projecting portion 41d). As described here, the plate spring portion 54 is elastically deformable so that its end portion moves in the thickness direction of the circuit board 3.

As illustrated in FIG. 5, the plate spring portion 54 in this example extends from the fixed portion 51a. Therefore, the base 54a of the plate spring portion 54 is situated near the screw 61 provided in the fixed portion 51a. Specifically, as illustrated in FIG. 5, a distance between the base (portion connected to the edge 51c) 54a of the plate spring portion 54 and a center C of the hole 51b is smaller than a diameter R of the fixed portion 51a (distance between the center C of the hole 51b and an outer edge 51d of the fixed portion 51a). Further, a distance D1 between the base 54a and a straight line L1 passing the center C of the hole 51b and being orthogonal to the extending direction of the contact portion 51 (direction along the edge of the lower shield 5) is smaller than a distance D2 between the straight line L1 and an end portion 51e of the fixed portion 51a in the extending direction of the contact portion 51 (the end portion of the fixed portion 51a is defined as a point from which a width of the contact portion 51 starts to increase).

As described above, the plurality of fixed portions 51a aligned at intervals are provided in the contact portion 51 of the lower shield 5 (see FIG. 3 or FIG. 4). Each of the plate spring portions 54 is situated between two fixed portions 51a. That is, one fixed portion 51a is provided to the base 54a of a plate spring portion 54, and another fixed portion 51a is situated ahead of the distal end of the same plate spring portion 54.

As illustrated in FIG. 6, a protection wall portion 55 for protecting the abutting portion 54c of the plate spring portion 54 is provided at the outer edge of the contact portion 51. The lower shield 5 is bent at the outer edge of the contact portion 51 toward the second shield 4, which forms the protection wall portion 55 in the lower shield 5. The protection wall portion 55 is arranged to face the side surface 3e of the circuit board 3 and formed to elongates in a direction along the side surface 3e of the circuit board 3. The protection wall portion 55 is formed to surround the abutting portion 54c. Specifically, a quadrangular part is cut out from the protection wall portion 55, and the abutting portion 54c is situated inside an edge 55a formed by the cutting out. With this structure, the abutting portion 54c is protected by the protection wall portion 55. Further, the protection wall portion 55 in this example is situated further away from the side surface 3e of the circuit board 3 than the abutting portion 54c. That is, the protection wall portion 55 is situated slightly outward than the projecting portion 41d of the upper shield 4 and the abutting portion 54c. With this structure, an external force is less likely to act on the abutting portion 54c of the plate spring portion 54.

As described above, the contact portion 51 provided on the edge of the lower shield 5 is in contact with the lower surface 3b of the circuit board 3, and the plate spring portion 54 is formed in the contact portion 51. Therefore, it is possible to improve the shield effect against the electromagnetic wave. Further, in comparison with a conventional electronic device in which the edge of the shield is situated at a position spaced apart from a surface of the circuit board and the edge has a plate spring formed thereon for contacting, it is possible to reduce a size of the plate spring portion 54 of the electronic device 1, and to suppress the plate spring portion 54 from receiving an improper external force.

Further, the contact portion 51 is included in one surface of the lower shield 5. According to this structure, the one surface of the lower shield 5 is in contact with the circuit board 3, and therefore the inside of the shield can be easily shielded from the outside.

Further, a part of the contact portion 51 is cut out, and the plate spring portion 54 is situated in the space corresponding to the cut-out part. According to this structure, it is possible to inhibit the plate spring portion 54 from protruding from the lower shield 5.

Further, the contact portion 51 of the lower shield 5 is fixed onto the one surface of the circuit board 3. According to this structure, it is possible to improve contact stability between the end portion of the plate spring portion 54 and the upper shield 4.

Further, the contact portion 51 of the lower shield 5 includes the fixed portion 51a provided with a fixture (the screw 61 in the above example) for fixing the contact portion 51 onto the one surface of the circuit board 3, and the plate spring portion 54 extends from the fixed portion 51a. According to this structure, it is possible to further improve the contact stability between the end portion of the plate spring portion 54 and the upper shield 4.

Further, the conductive pattern 3d for grounding is formed on the one surface of the circuit board 3, and the contact portion 51 of the lower shield 5 is in contact with the conductive pattern 3d. According to this structure, using the contact portion 51, electrical connection between the lower shield 5 and the circuit board 3 can be made. In other words, an additional member for establishing electrical connection is not needed at a position different from the contact portion 51 of the lower shield 5.

Further, the end portion of the plate spring portion 54 abuts on the edge of the upper shield 4, and the edge of the upper shield 4 is fixed to the circuit board 3. According to this structure, it is possible to improve the contact stability between the end portion of the plate spring portion 54 and the upper shield 4.

Further, the plate spring portion 54 extends in a direction along the edge of the lower shield 5. According to this structure, it becomes easy to form the plate spring portion 54 with an appropriate length.

Further, the plate spring portion 54 includes the elastic plate portion 54b extending in the direction along the edge of the lower shield 5 and capable of elastically warping. According to this structure, adjustment of a length of the elastic plate portion 54b can be facilitated. As a result, adjustment of the elastic force of the plate spring portion 54 can be facilitated.

Further, the elastic plate portion 54b is formed to be elastically deformable in the thickness direction of the circuit board 3, and presses, by the elastic force thereof, the end portion of the plate spring portion 54 against the upper shield 4. According to this structure, it is possible to inhibit the plate spring portion 54 from protruding from the edge of the lower shield 5. Specifically, incase where the elastic plate portion 54b is elastically deformed in a direction perpendicular to the thickness direction of the circuit board 3 and perpendicular to the edge of the lower shield 5, the elastic plate portion 54b would be designed to protrude from the edge of the lower shield 5, and hence the elastic plate portion 54b would have interference with other member and receive an improper external force. According to the structure described above, it is possible to prevent such a problem.

Yet further, the elastic plate portion 54b includes, at the end portion thereof, an abutting portion 54c extending toward the upper shield 4. According to this structure, it is possible to reduce an inclination of the elastic plate portion 54b toward the upper shield 4.

Further, the end portion of the plate spring portion 54 is bent toward the upper shield 4. According to this structure, it is possible to reduce an inclination of the plate spring portion 54.

Further, the edge of the upper shield 4 is situated further outward than the edge of the circuit board 3, and the end portion of the plate spring portion 54 is abut on the edge of the upper shield 4. According to this structure, it is possible to establish contact between the plate spring portion 54 and the upper shield 4 without cutting out a part of the edge of the circuit board 3.

Further, the abutting portion 54c extends toward the upper shield 4, and is formed to face a side surface 3e of the circuit board 3, the side surface 3e defining a thickness of the circuit board 3. Further, the lower shield 5 includes the protection wall portion 55 which faces the side surface 3e of the circuit board 3 and is formed to surround the abutting portion 54c. According to this structure, it is possible to protect the abutting portion 54c by the protection wall portion 55.

Further, the protection wall portion 55 is situated further away from the side surface 3e of the circuit board 3 than the abutting portion 54c. According to this structure, it is possible to further reliably protect the abutting portion 54c.

Note that, the present invention is not limited to the above-mentioned electronic device 1, and various modifications may be made.

For example, in the above description, the contact portions 41, 51 are provided with the fixed portions 41a, 51a, respectively, and the contact portions 41, 51 are fixed respectively onto the upper surface 3a and the lower surface 3b of the circuit board 3 through the fixed portions 41a, 51a. However, portions for fixing the upper shield 4 and the lower shield 5 onto the circuit board 3 may be provided at positions other than the contact portions 41, 51. For example, the portions for fixing the upper shield 4 and the lower shield 5 onto the circuit board 3 may be provided to the main panel portions 42, 52.

In the above description, the edge of the upper shield 4 is situated further outward than the edge of the circuit board 3, and the contact portion 41 of the upper shield 4 includes the projecting portion 41d. Further, the plate spring portion 54 abuts on the projecting portion 41d. However, the upper shield 4 does not need to be provided with the projecting portion 41d described above. In this case, for example, a recess may be formed in a part of the edge of the circuit board 3, and the plate spring portion 54 may abut on a portion of the upper shield 4 surrounded by the recess (that is, surface exposed through the recess).

Further, in the above description, the conductive pattern 3d is formed on the peripheral edge of the lower surface 3b of the circuit board 3. The contact portion 51 is in contact with the conductive pattern 3d. However, the position, at which the conductive pattern 3d is formed, is not limited thereto. For example, the conductive pattern 3d may be formed at a position separated from the edge of the circuit board 3 (for example, center portion of the circuit board 3). In this case, the main panel portion 52 of the lower shield 5 may have a protrusion formed therein, which protrudes toward the circuit board 3 to be in contact with the conductive pattern 3d.

While there have been described what are at present considered to be certain embodiments of the invention, it will be understood that various modifications may be made thereto, and it is intended that the appended claims coverall such modifications as fall within the true spirit and scope of the invention.

What is claimed is:

1. An electronic device, comprising:
a circuit board;
a first shield covering one surface of the circuit board;
a contact portion formed in the first shield and in contact with the one surface of the circuit board;
a connecting portion formed in the first shield, located on the one surface of the circuit board extending from the contact portion along an edge of the circuit board and being elastically deformable so that an end portion thereof moves in a thickness direction of the circuit board;
a second shield covering another surface of the circuit board; and
an abutting portion bent from the end portion of the connecting portion to thereby be located outside the edge of the circuit board and extend toward the second shield and abutting on the second shield.

2. The electronic device according to claim 1, wherein a part of the contact portion is cut out, and at least one part of the connecting portion is situated in a space corresponding to the cut-out part.

3. The electronic device according to claim 1, wherein the contact portion of the first shield is fixed onto the one surface of the circuit board.

4. The electronic device according to claim 3, wherein:
the contact portion of the first shield includes a fixed portion provided with a fixture for fixing the contact portion onto the one surface of the circuit board; and
the connecting portion extends from the fixed portion.

5. The electronic device according to claim 3, wherein:
a conductive pattern for grounding is formed on the one surface of the circuit board; and
the contact portion of the first shield is in contact with the conductive pattern.

6. The electronic device according to claim 1, wherein:
the end portion of the connecting portion abuts on an edge of the second shield; and
the edge of the second shield is fixed to the circuit board.

7. The electronic device according to claim 1, wherein the connecting portion includes an elastic portion extending in the direction along the edge of the first shield and capable of elastically warping.

8. The electronic device according to claim 7, wherein the elastic portion is formed to be elastically deformable in the thickness direction of the circuit board, and the elastic portion presses the end portion of the connecting portion against the second shield by an elastic force of the elastic portion.

9. The electronic device according to claim 1, wherein:
at least one part of an edge of the second shield is situated further outward than an edge of the circuit board; and
the end portion of the connecting portion abuts on the at least one part of the edge of the second shield.

10. The electronic device according to claim 1, wherein:
the abutting portion faces a side surface of the circuit board, the side surface defining a thickness of the circuit board; and
the first shield includes a wall portion facing the side surface of the circuit board, the wall portion being formed to surround the abutting portion.

11. The electronic device according to claim 10, wherein the wall portion is situated further away from the side surface of the circuit board than the abutting portion.

* * * * *